(12) United States Patent
Olivier et al.

(10) Patent No.: US 11,929,603 B2
(45) Date of Patent: Mar. 12, 2024

(54) CABLE MANAGEMENT SYSTEM AND ASSEMBLY

(71) Applicant: SMART LOCKING LOGIC (PTY) LTD, Centurion (ZA)

(72) Inventors: Johan Olivier, Centurion (ZA); Marlene Van Aswegen, Pretoria (ZA)

(73) Assignee: SMART LOCKING LOGIC (PTY) LTD, Centurion (ZA)

( * ) Notice: Subject to any disclaimer, the term of this patent is extended or adjusted under 35 U.S.C. 154(b) by 164 days.

(21) Appl. No.: 17/632,348

(22) PCT Filed: Jul. 15, 2020

(86) PCT No.: PCT/IB2020/056653
§ 371 (c)(1),
(2) Date: Feb. 2, 2022

(87) PCT Pub. No.: WO2021/024058
PCT Pub. Date: Feb. 11, 2021

(65) Prior Publication Data
US 2022/0294203 A1     Sep. 15, 2022

(30) Foreign Application Priority Data

Aug. 6, 2019 (ZA) ................................ 2019/05179

(51) Int. Cl.
*H02G 9/10* (2006.01)
*H02G 11/00* (2006.01)
(Continued)

(52) U.S. Cl.
CPC .............. *H02G 9/10* (2013.01); *H02G 11/00* (2013.01); *H02G 3/08* (2013.01); *H02G 3/16* (2013.01);
(Continued)

(58) Field of Classification Search
CPC ........ H02G 9/10; H02G 11/10; H02G 11/006; H02G 11/00; H02G 3/08; H02G 3/16; H05K 7/1411
See application file for complete search history.

(56) References Cited

U.S. PATENT DOCUMENTS 6,869,296 B2    3/2005  Van Leest
7,189,924 B1*   3/2007  Popescu ............... H05K 7/1491
                                                    361/825

(Continued)

FOREIGN PATENT DOCUMENTS

EP    2111090 B1 *  4/2013  .......... H05K 7/1491
FR    2 703 847 A1  10/1994
(Continued)

OTHER PUBLICATIONS

English language Abstract of FR2985389.
English language Abstract of FR2703847.

*Primary Examiner* — Tan Le
(74) *Attorney, Agent, or Firm* — Ware, Fressola, Maguire & Barber LLP

(57) ABSTRACT

A cable management system for an enclosed chamber includes a fixed member which has attachment formations associated therewith for attachment to the enclosed chamber and a displaceable member which is displaceable relative to the fixed member between at least an extended condition and a retracted condition and which has cable fixing formations. The cable management system includes a guide mechanism for guiding the relative displacement of the displaceable member relative to the fixed member, wherein the cable fixing formations are configured to fix at least one cable at a first point to the displaceable member, such that displacement of the displaceable member causes the cable to be displaced therewith. The cable management system may also form part of a cable management assembly which (Continued)

includes an enclosed chamber to which the fixed member is attached or attachable.

11 Claims, 11 Drawing Sheets

(51) Int. Cl.
    *H02G 3/08*          (2006.01)
    *H02G 3/16*          (2006.01)
    *H05K 7/14*          (2006.01)

(52) U.S. Cl.
    CPC .......... *H02G 11/006* (2013.01); *H05K 7/1411* (2013.01)

(56) References Cited

U.S. PATENT DOCUMENTS

| | | | |
|---|---|---|---|
| 10,802,237 B2 * | 10/2020 | Bakatsias | G02B 6/44528 |
| 2005/0135768 A1 * | 6/2005 | Rapp | G02B 6/44524 |
| | | | 385/135 |
| 2010/0206104 A1 | 8/2010 | Pfister et al. | |
| 2010/0258350 A1 * | 10/2010 | Hallett | H05K 7/1491 |
| | | | 174/99 R |
| 2010/0322577 A1 | 12/2010 | Bolster et al. | |
| 2016/0309611 A1 | 10/2016 | Yi | |
| 2018/0157000 A1 | 6/2018 | Bakatsias et al. | |
| 2019/0058317 A1 * | 2/2019 | Chen | H05K 7/14 |

FOREIGN PATENT DOCUMENTS

| | | |
|---|---|---|
| FR | 2 985 389 A1 | 7/2013 |
| GB | 2 277 812 A | 11/1994 |

* cited by examiner

CABLE MANAGEMENT SYSTEM AND ASSEMBLY

CROSS REFERENCE TO RELATED APPLICATIONS

The application corresponds to PCT/IB2020/056653, filed 15 Jul. 2020, which claims benefit to South African serial no. 2019/05179, filed 6 Aug. 2019, which are all incorporated by reference in their entirety.

FIELD OF INVENTION

The invention relates to cable management and specifically to a cable management system appropriate for use in an enclosed chamber like a manhole chamber.

BACKGROUND OF INVENTION

The Applicant works with cables (whether electrical or optical) which may be used for telecommunications. Cables are often arranged, terminated, split, etc. in an enclosure or junction box. Access to the cables may be required for any number of reasons like maintenance, upgrades, new installations, etc.

A problem that the Applicant has encountered is that either it is very difficult to access the cables in the enclosure or opening/removal of the junction box can cause damage to the cables (e.g., by pulling or bending them past their points of tolerance). Accordingly, the Applicant desires a cable management system which enables improved access to cables in an enclosure.

SUMMARY OF INVENTION

Accordingly, the invention provides a cable management system for an enclosed chamber, wherein the cable management system includes:
  a fixed member which has attachment formations associated therewith for attachment to the enclosed chamber;
  a displaceable member which is displaceable relative to the fixed member between at least an extended condition and a retracted condition and which has cable fixing formations; and
  a guide mechanism for guiding the relative displacement of the displaceable member relative to the fixed member,
  wherein the cable fixing formations are configured to fix at least one cable at a first point to the displaceable member, such that displacement of the displaceable member causes the cable to be displaced therewith.

The guide mechanism may be integrated with one or both of the fixed and/or displaceable members or it may be separate therefrom.

The cable management system may include a displacement mechanism configured to cause displacement of the displaceable member relative to the fixed member. The displacement mechanism may be integrated with the guide mechanism or may be separate therefrom. The displacement mechanism may include an actuator to translate an input from a user to displacement of the displaceable member.

The actuator may be mechanical, pneumatic, hydraulic, etc. The actuator may include an internal power source (e.g., a battery) or may be configured to receive power from an external source.

In one embodiment, the displacement mechanism may include a threaded shank with a travelling nut, the threaded shank connected to one of the fixed member or the displaceable member and the travelling nut may be connected to the other of the displaceable member or the fixed member. The actuator may be a mechanical coupling (e.g., a spigot/socket) configured to receive mechanical rotational input from an external driver.

The cable fixing formations may be configured to permit flexing of the cable to permit relative displacement of the fixed and displaceable members without damage or strain on the cable. For example, in the retracted condition the cable may have some slack and in the extended condition the cable may have less slack or may be somewhat taught.

The cable management system may include at least one cable guide. The cable guide may extend between the fixed and displaceable members. The cable guide may extend from the cable fixing formations of the displaceable member. The cable guide may define first and second cable entry/exit points, one at each end. The second cable entry/exit points may be fixed relative to the fixed member and the first cable entry/exit points may be fixed relative to the displaceable member, the first and second cable entry/exit points thus being displaceable relative to each other.

The cable guide may be in the form of a flexible conduit or tube, or a cluster/bundle of flexible conduits/tubes. The cable guide may serve to protect and/or guide the cables during relative displacement of the fixed and displaceable members. For example, the cable guide may be flexible, but less flexible than the cable, thereby preventing or inhibiting flexing of the cable more than it is elastically able to flex. For example, the cable guide may be sufficiently long in that it permits the displaceable member to be fully extended from the fixed member such that any cable within the cable guide would also be sufficiently long to permit the relative displacement. The cable guide may be coiled in the retracted condition and uncoiled or partially uncoiled in the extended condition.

The fixed and/or displaceable members may define an internal cavity. The fixed and/or displaceable members may restrict or inhibit access to the cable, or to the cable fixing formations, in the retracted condition. The fixed and/or displaceable members may permit access, or be more accessible, to the cable, or to the cable fixing formations, in the extended condition.

The cable may be one or more of on optical fibre cable or an electrical cable (for power and/or data communication).

The attachment formations could be integral with the fixed member or separate therefrom. The attachments formations may be configured to receive or locate mechanical fasteners.

The cable fixing formations may be first cable fixing formations and the cable management system may include second cable fixing formations provided by, or on, the fixed member.

The invention extends to a cable management assembly which includes:
  the cable management system as defined above; and
  an enclosed chamber to which the fixed member is attached or attachable.

The enclosed chamber may be a manhole chamber, a cable management box, a cable distribution board, a junction box, or the like.

The cable fixing formations may be first cable fixing formations and the cable management assembly may include second cable fixing formations provided on, or by, the enclosed chamber.

Accordingly, the cable or cables may extend between the first cable fixing formations on the displaceable member and the second cable fixing formations on the enclosed chamber for controlled management of cables extending between predefined points in the different structures. This may permit displacement of the displaceable member—and accordingly access to the cables—without damaging or compromising the cables.

The first and second cable fixing formations may serve to fix the cables directly or may serve to fix the cable guide thereby fixing the cables indirectly.

A distance between the first and second cable fixing formations may change based on the relative displacement of the fixed and displaceable members. The distance between the first and second cable fixing formations may be smaller when in the retracted condition and may be greater when in the extended condition.

BRIEF DESCRIPTION OF DRAWINGS

The invention will now be further described, by way of example, with reference to the accompanying diagrammatic drawings.

In the drawings.

DETAILED DESCRIPTION OF EXAMPLE EMBODIMENT

The following description of an example embodiment of the invention is provided as an enabling teaching of the invention. Those skilled in the relevant art will recognise that changes can be made to the example embodiment described, while still attaining the beneficial results of the present invention. It will also be apparent that some of the desired benefits of the present invention can be attained by selecting some of the features of the example embodiment without utilising other features. Accordingly, those skilled in the art will recognise that modifications and adaptations to the example embodiment are possible and can even be desirable in certain circumstances and are a part of the present invention. Thus, the following description of the example embodiment is provided as illustrative of the principles of the present invention and not a limitation thereof.

Figure 1:
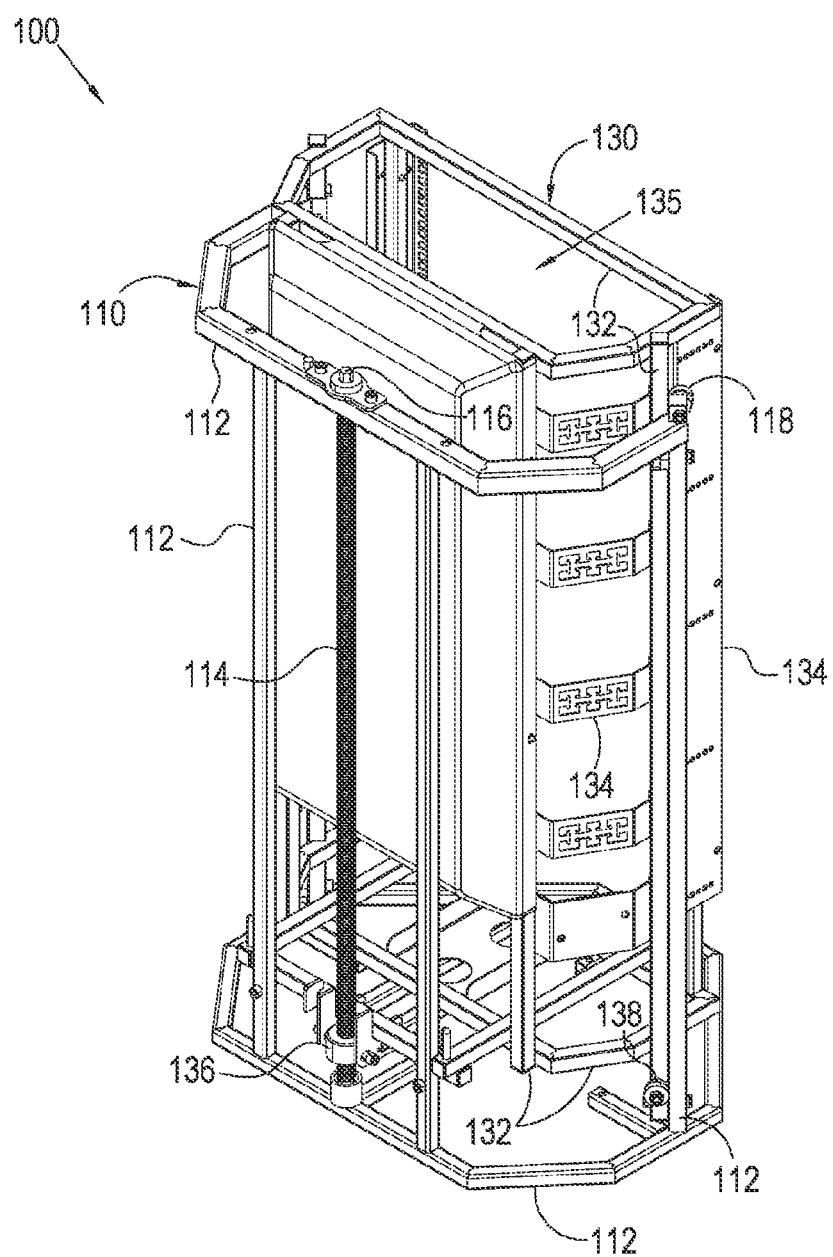
FIG. 1 shows a three-dimensional view from one side of a cable management system, in its retracted condition, in accordance with the invention.
Figure 2:
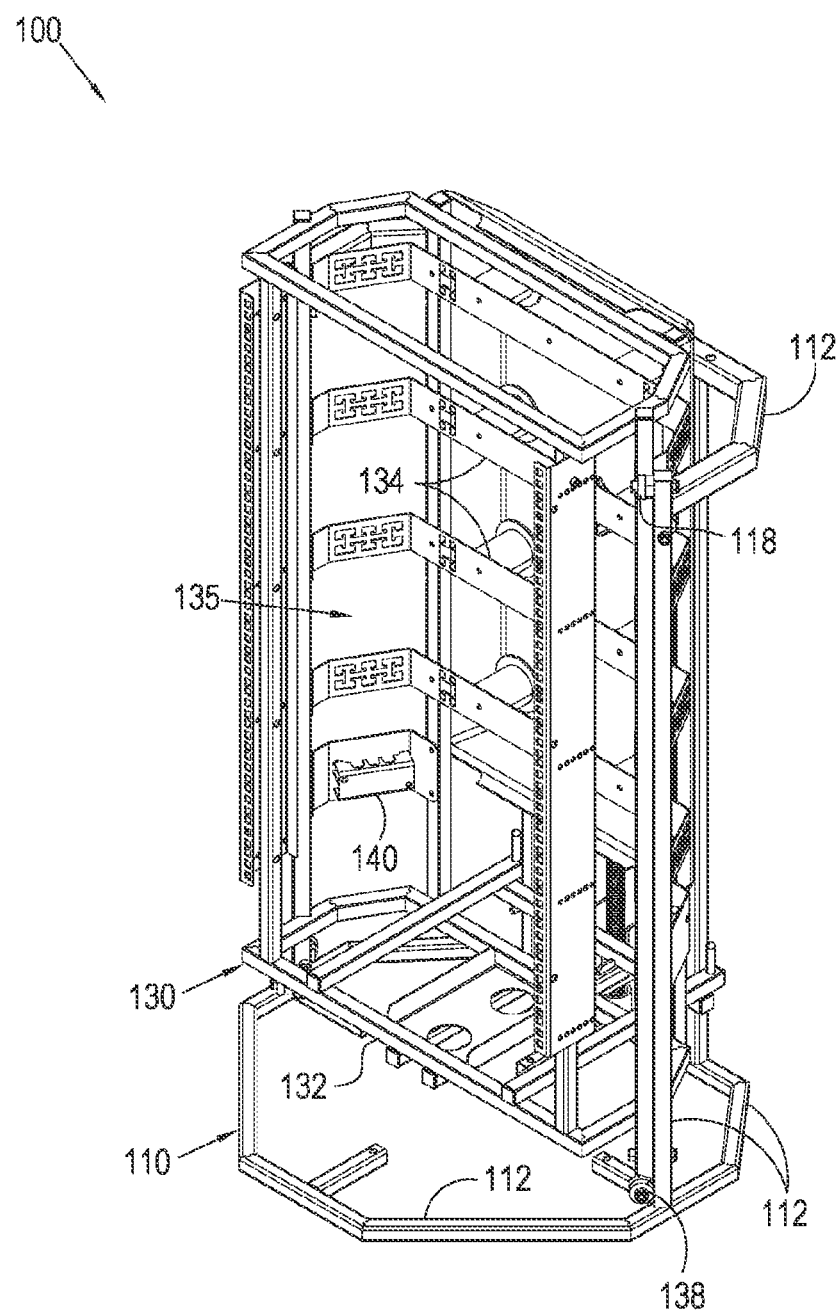
FIG. 2 shows a three-dimensional view from another side of the cable management system of FIG. 1.
Figure 3:
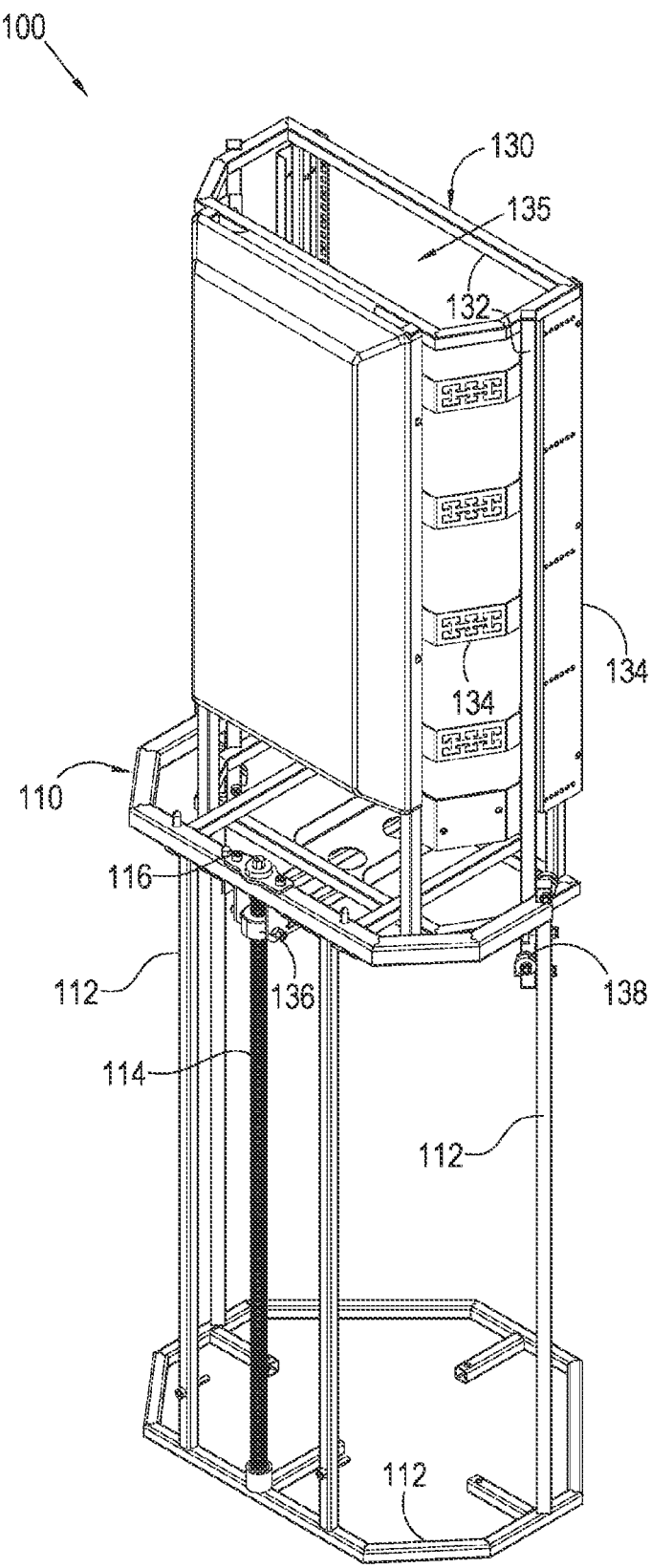
FIG. 3 shows a three-dimensional view from one side of the cable management system of FIG. 1 in an extended condition.
Figure 4:
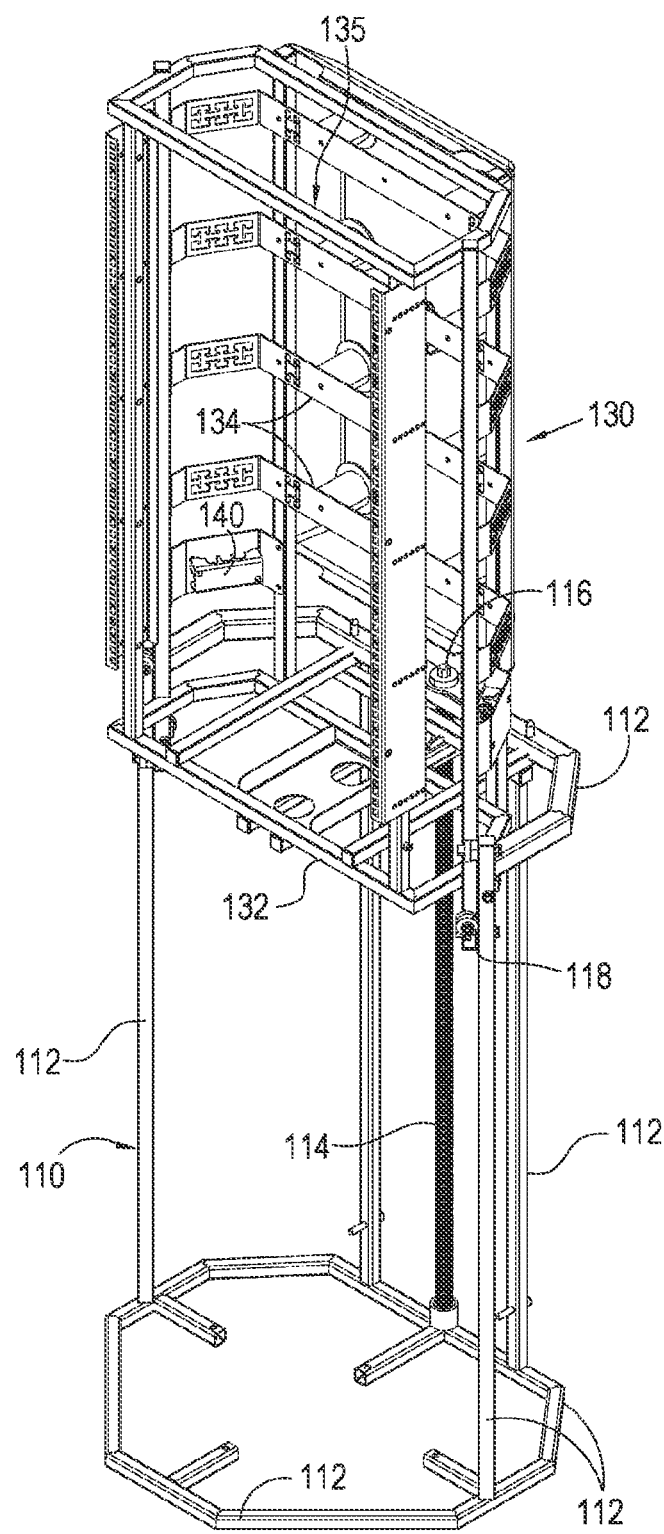
FIG. 4 shows a three-dimensional view from another side of the cable management system of FIG. 3.
Figure 5:
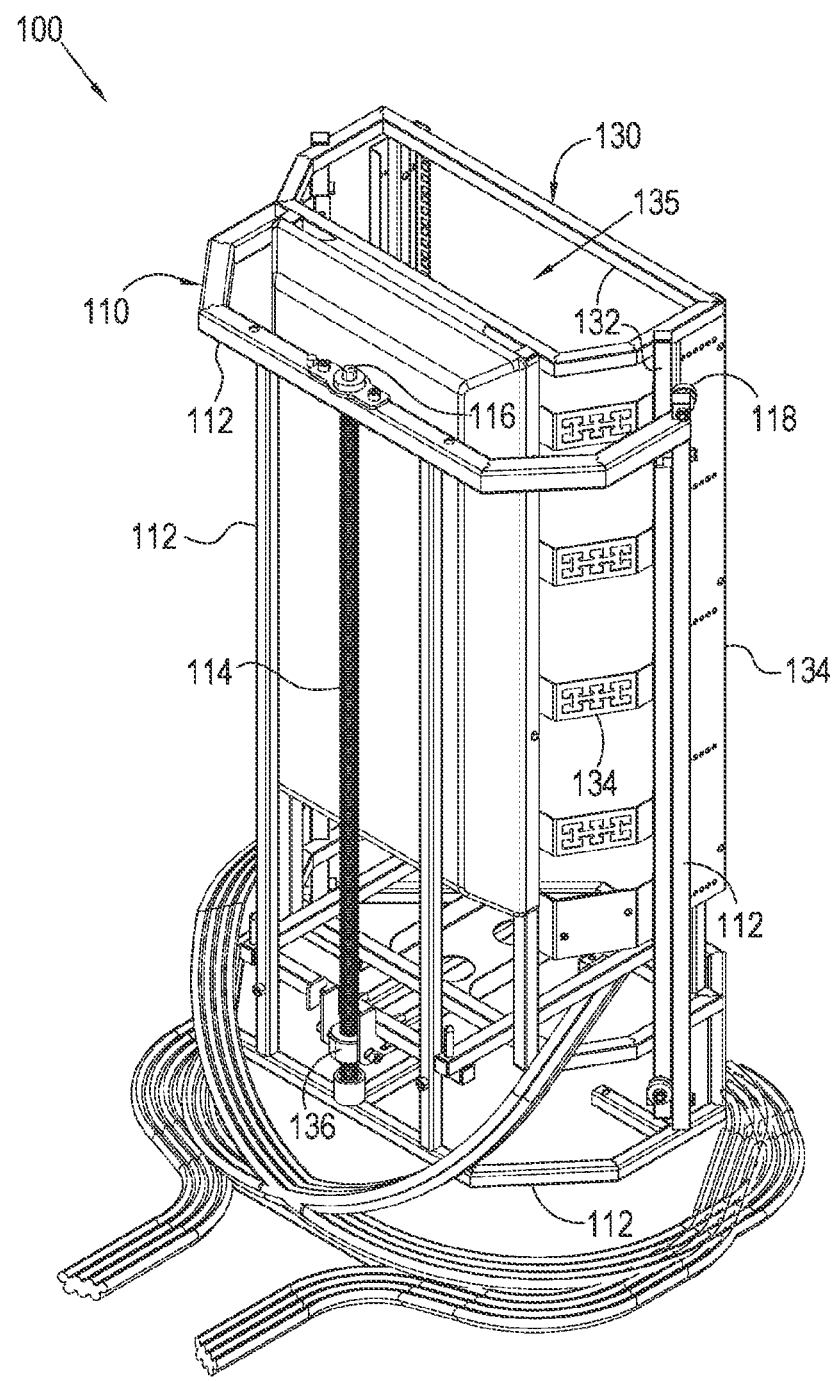
FIG. 5 shows a three-dimensional view from one side of the cable management system of FIG. 1, including cable guides.
Figure 6:
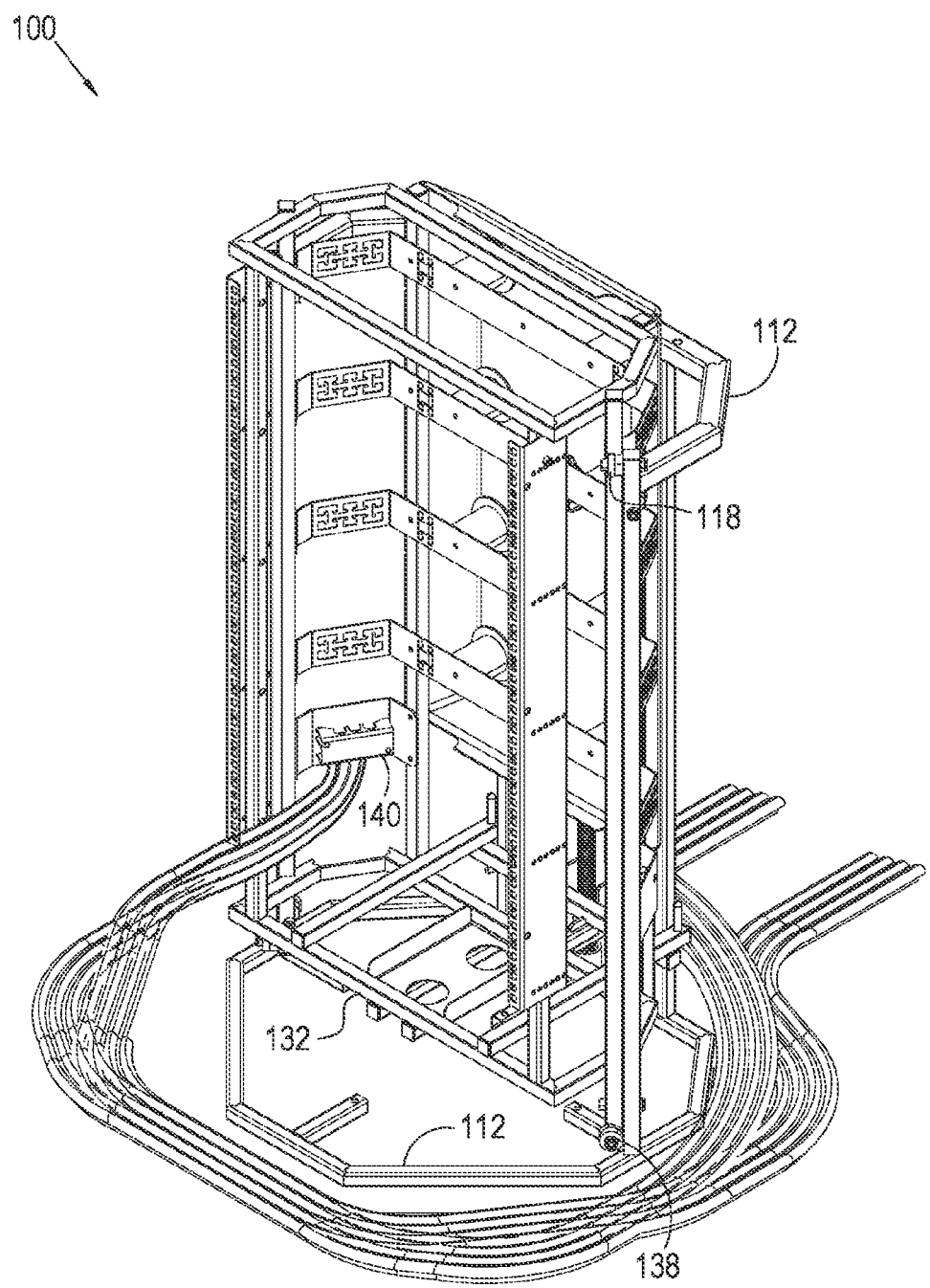
FIG. 6 shows a three-dimensional view from another side of the cable management system of FIG. 5.
Figure 7:
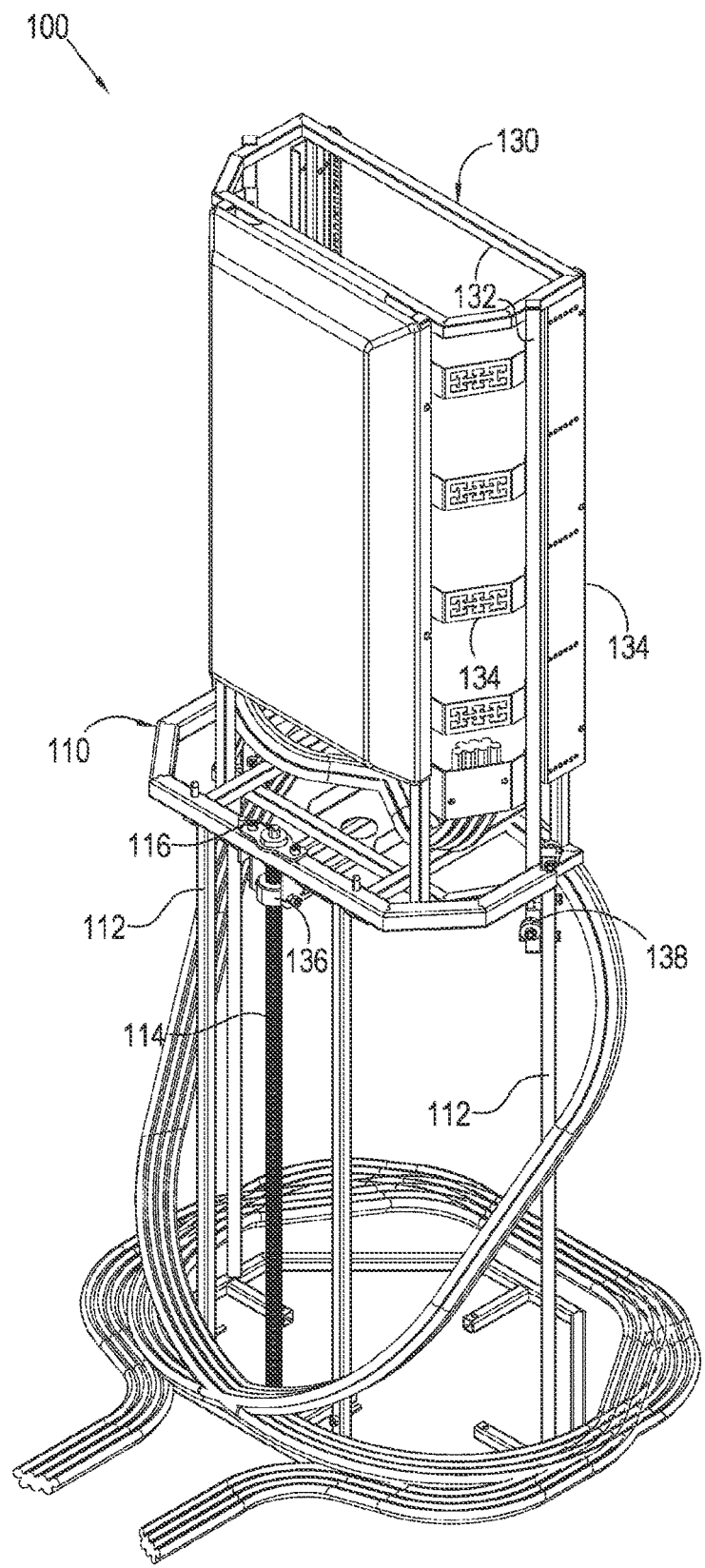
FIG. 7 shows a three-dimensional view from one side of the cable management system of FIG. 3, including cable guides.
Figure 8:
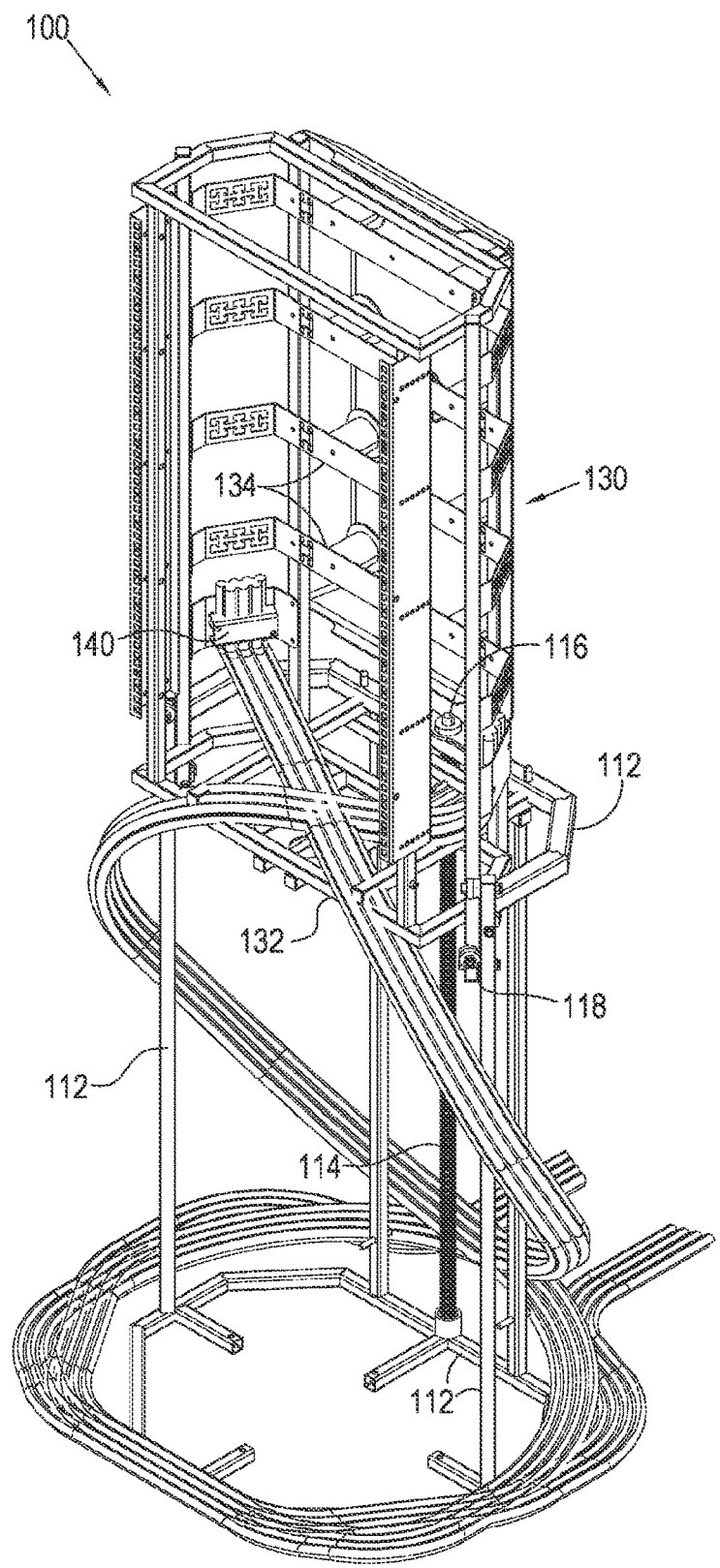
FIG. 8 shows a three-dimensional view from another side of the cable management system of FIG. 7.

FIGS. 1-2 show a cable management system 100 in its retracted condition while FIGS. 3-4 show the cable management system 100 in its extended condition.

The cable management system 100 has a fixed member 110 and a displaceable member 130 which is displaceable relative to the fixed member 110. The fixed member 110 is in the form of a framework comprising a series of interconnected elongate support bars 112. The fixed frame member 110 has an irregularly octagonal shaped footprint.

The fixed member 110 has an upright threaded shaft 114 rotatably mounted to upper and lower transverse bars 112. The threaded shaft 114 extends most or all of a height of the fixed member 110 and has a mechanical coupling in the form of a hexagonal spigot 116 at its top end. The spigot 116 is configured to receive a driver tool to rotate the spigot 116 thereby to rotate the shaft 114.

The fixed member 110 has a pair of roller wheels 118 on opposite upright bars 112 at its upper end. The fixed member 110 has, at its lower end, attachment formations in the form of apertures 120 configured to receive mechanical fasteners like screws or rivets to attach it to a part of a chamber which could be a manhole, junction box, etc.

The displaceable member 130 is similar in size and shape to the fixed member 110 but slightly smaller—it fits neatly inside the framework of the fixed member 110. The displaceable member 130 is similarly formed of a series of interconnected elongate support bars 132 but additionally includes some planar panels 134 and support elements too. The support bars 132 and panels 134 loosely define an internal cavity 135 which may be used for accommodating cables, devices, equipment, or the like, or merely for providing access to such cables, devices, etc.

The displaceable member 130 has a threaded nut 136 fixed to one of its lower transverse bars 132. The nut 136 threadedly accommodates, in use, the threaded shaft 114. Accordingly, as the nut a rotational fixed, rotation of the threaded shaft 114 causes the nut 136 to travel either up or down a length of the threaded shaft 114. Thus, the threaded shaft 114 (mounted to the fixed member 110) and the travelling nut 136 (mounted to the displaceable member 130) act as a displacement mechanism. Actuation of the spigot 116 (e.g., by a drill driver with a suitable hex socket bit) causes rotation of the threaded shaft 114 which causes either raising or lowering of the displaceable member 130, ultimately to the retracted condition (FIGS. 1-2) or to the extended condition (FIGS. 3-4).

The displaceable member 130 also has a pair of roller wheels 138, which are positioned on opposite upright bars 132 at a lower end of the displaceable member 130. The upright bars 112, 132 and roller wheels 118, 138 of the fixed and displaceable members 110, 130 act as a guide mechanism (together with the threaded shaft 114 and nut 136). The roller wheels 118, 138 of one member 110, 130 (either the fixed member 110 or the displaceable member 130) cooperate with and bear against the upright bars 112, 132 of the other member 130, 110 (the other of the displaceable member 130 or the fixed member 110) and vice versa. This provides smooth and guided retraction and extension of the displaceable member 130 relative to the fixed member 110.

The cable management system 100 includes cable fixing formations. The specific configuration of the cable fixing formations may vary depending on the type of cables which the cable management system 100 is intended to accommodate. In this example, the cable management system 100 may be aimed at optical fibre cables. Cable fixing formations 140 (which are first cable fixing formations 140, as will become apparent below) are provided on an inside of some of the panels 134 of the displaceable member 130. The fixing formations 140 are in the form of a pair of opposed harnesses or locating formations directed towards the internal cavity 135. In one embodiment, the fixing formations 140 may be configured for receiving and fixing the cables directly; however, in this embodiment, the fixing formations 140 accommodate a cable guide 150 (refer to FIGS. 5-8).

The cable guide 150 includes elongate, flexible tubes or sleeves. In this example, there are two cable guides 150. Each cable guide 150 has a series (about four) of tubes or channels for accommodating cables. The cable guides 150 are fixed at one end to the cable fixing formations 140, directed out of the internal cavity 135 and coiled around a base of the fixed member 110. Cables may be pulled or threaded through one of the channels defined by the cable guides 150.

Differently stated, each cable guide 150 has two entry/exit points, a first cable entry/exit point fixed relative to the displaceable member 130 and a second cable entry/exit point fixed relative to the fixed member 110. An advantage of this may be that equipment (e.g., joints, splitters, etc) can be house within the internal cavity 135 of the displaceable member 130. The equipment and/or cables can therefore be fixed relative to the displaceable member 130.

Figure 9:
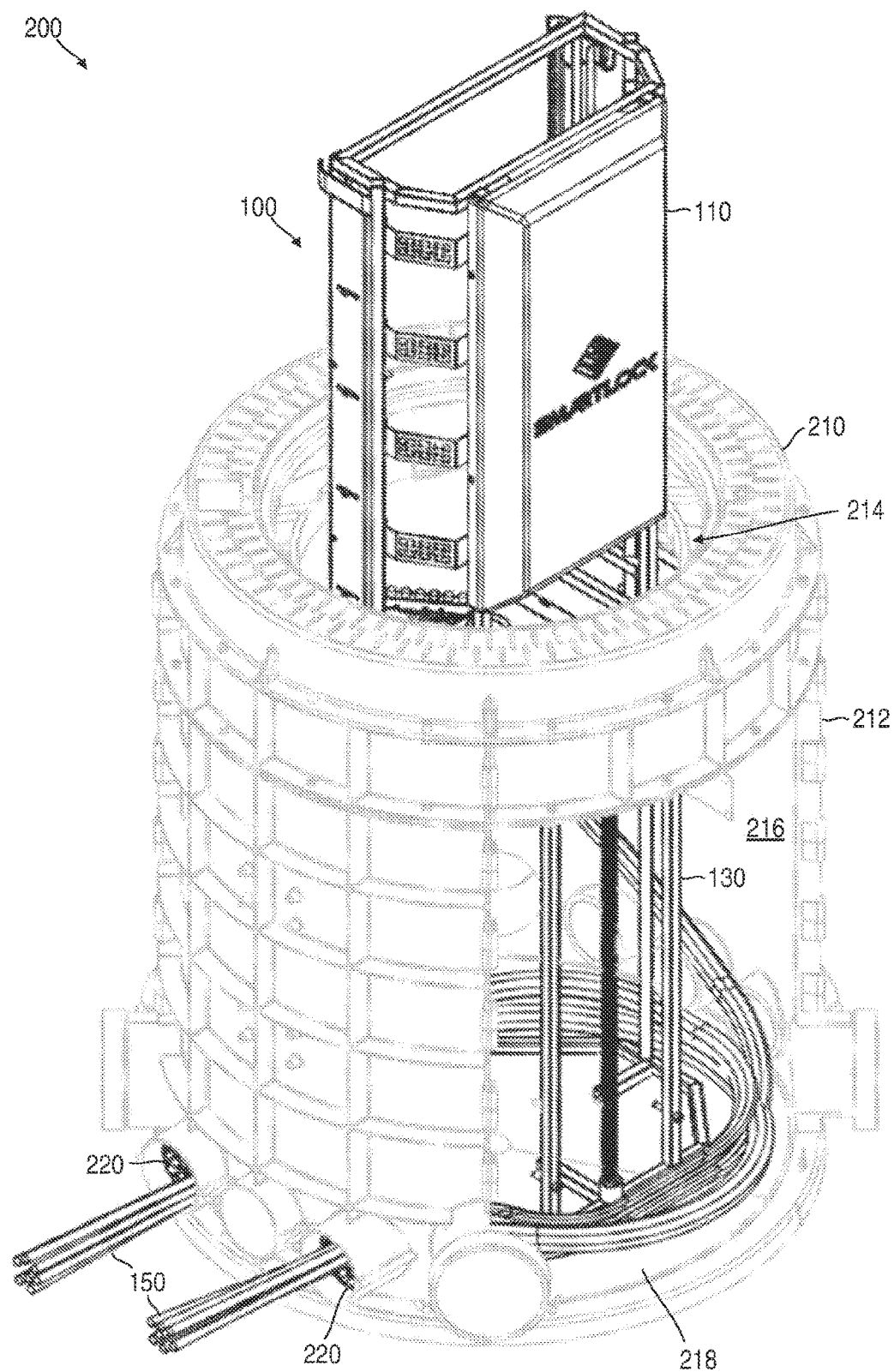
FIG. 9 shows a three-dimensional cut away view from one side of a cable management assembly including the cable management system of FIG. 5.
Figure 10:
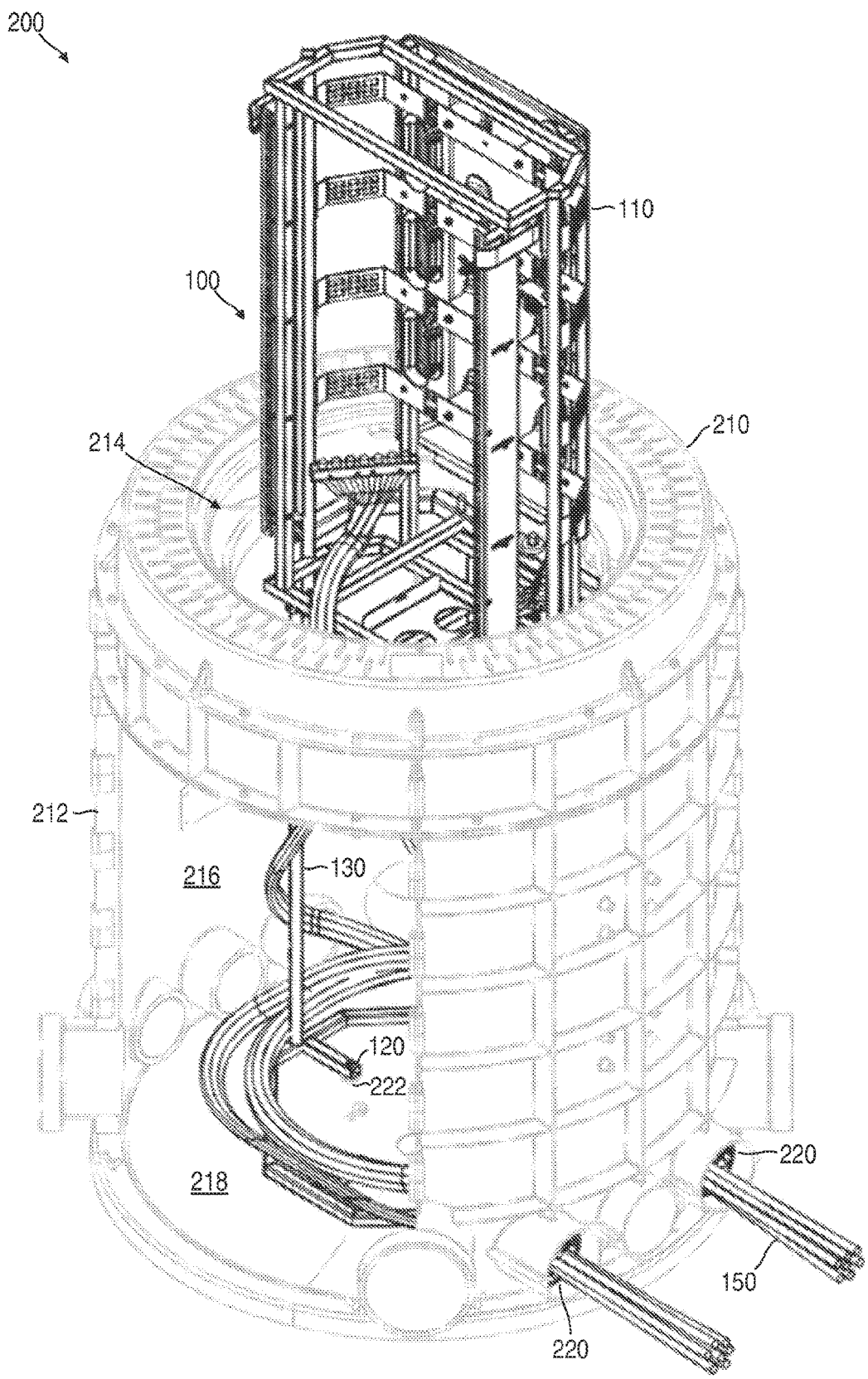
FIG. 10 shows a three-dimensional cut away view from another side of the cable management assembly of FIG. 9.
Figure 11:
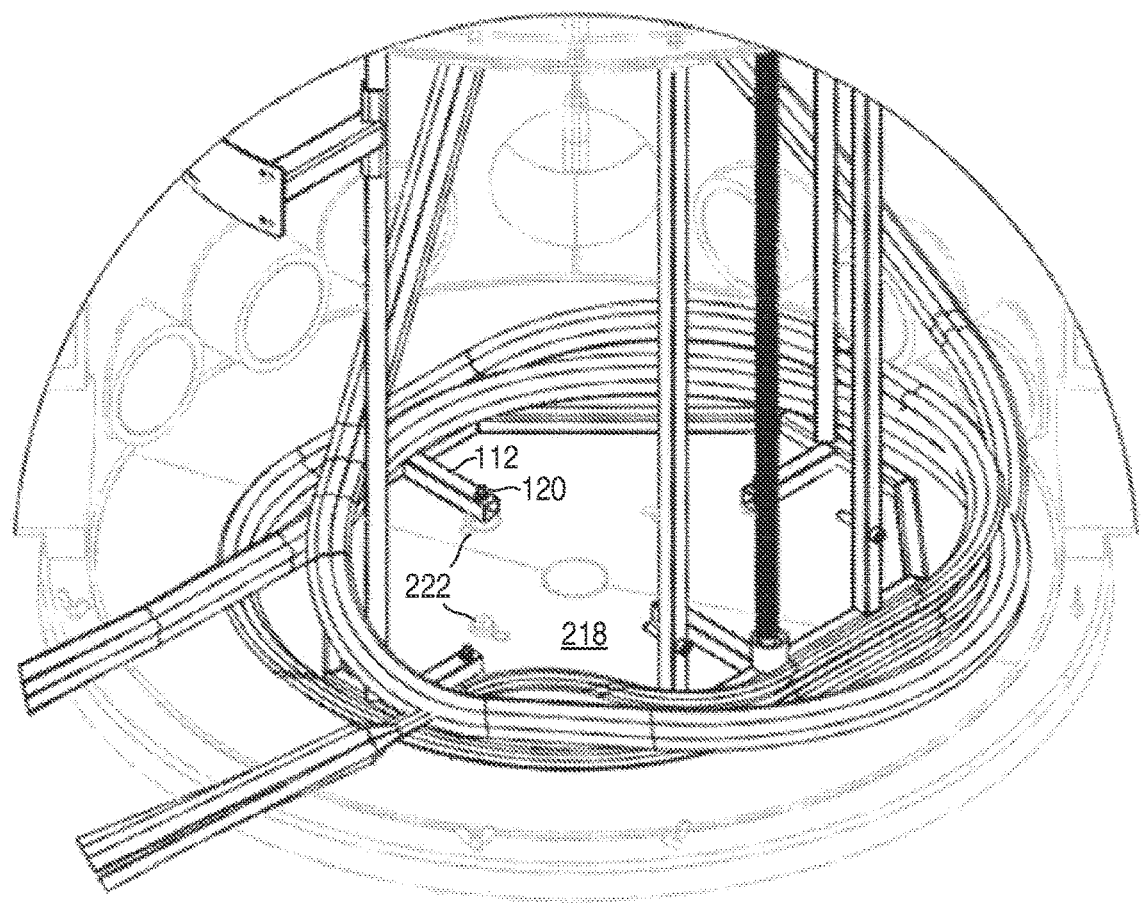
FIG. 11 shows a three-dimensional enlarged view of part of the cable management assembly of FIG. 9.

With reference to FIGS. 9-11, The cable management system 100 is intended to be used with, and placed inside, an enclosed chamber. An example of such an enclosed chamber is a manhole chamber. Accordingly, the invention extends to a cable management assembly 200 which includes a manhole chamber 210.

The manhole chamber 210 may be conventional in some respects, having a cylindrical body 212 defining a circular opening 214 at it stop, an internal cavity 216 defined within the body 212, and a base 218. The opening 214 may be closed with a manhole cover (not illustrated). In FIGS. 9-10, the manhole body 212 is illustrated with a portion cut away to reveal its innards.

FIGS. 9-10 illustrate the cable management system 100 in its extended condition with the displaceable member 130 projecting upwardly through the opening of the manhole chamber 210. This illustrates an advantage of the disclosure: the displaceable member 130—and any cables attached thereto or components contained therein—can be easily accessed in the extended condition.

The manhole chamber 210 has second cable fixing formations 220 defined in ports at a lower end thereof. The second cable fixing formations 220 may be in the form of a grommet or plug which allows through-passage of the cable guides 150 while clamping or fixing it in place. Accordingly, the cable guide 150 (and hence cables accommodated within the cable guide 150) are fixed in two places: one at the first cable fixing formations 140 and the other at the second cable fixing formations 220 which are fixed. (In another embodiment, the second cable fixing formations may have been provided on the fixed member 110.)

This illustrates another advantage of the present disclosure: the displacement of the displaceable member 130 out of the manhole chamber 210 is cable-safe because the cables (with or without the cable guides 150) are fixed in two places with sufficient slack to accommodate the displacement and are guided around the fixed member 110. This permits access to the cables and/or equipment, and permits installation of new cables, without jeopardizing cable integrity; more specifically, the cables will not be pinched or bent when the displaceable member 130 is retracted or pulled when it is extended.

FIG. 11 illustrates the fixed member 110 attached to the base 218 of the manhole chamber 210. The apertures 120 in the fixed member 110 receive mechanical fasteners (like screws/bolts) and are fastened to complemental formations 222 (like lugs/sockets) provided in the base 218. This ensures that the fixed member 110 remains fixed and does not shift during displacement of the displaceable member 130. The positioning of the complemental formations 222 on the base 218 may be to space the fixed member 110 centrally in the internal cavity 216 with sufficient clearance around it between the body 212 for the cabling and cable guides 150.

In use, a user (e.g., a maintenance man) wishes to access cables or equipment within the cable management system 100. He opens the manhole door of the manhole chamber 210 to reveal the cable management system 100—usually a top of the cable management system 100. He uses a tool—a drill driver with a suitable bit—to engage the hex spigot 116 and rotates it. This causes rotation of the threaded shank 114 which in turn causes the nut 136, and the displaceable member 130 to which the nut 136 is attached, to travel upwardly, into the extended condition.

The roller wheels 118, 138 and bars 112, 132 result in controlled, guided displacement of the displacement member 130 upwardly. The nut 136 stops when it contacts a crossbar of the fixed member 110. A distance the displaceable member 130 is displaced is just short of a height of the threaded shaft 114 and this depends on dimensions of the cable management system 100. The displaced distance may be 10-100 cm, e.g., 30-50 cm.

During displacement, the cable guides 150 are slowly lifted and any cables accommodated therein are lifted with it. However, the entry/exit points of the cable guides 150 remain fixed by the respective first and second cable fixing formations 140, 220 to the respective displaceable member 110 and the manhole chamber 210, ensuring that displacement can be effected without damaging cables.

Now, the internal cavity 135 of the displaceable member 130 is exposed and may be accessed by the user. The user may perform work which may include running cables, repairing equipment, etc. Once the user is finished, he ensures that equipment and or cables are clearly accommodated within the internal cavity 135 and drives the hex spigot 116 in a reverse direction. The displaceable member 130 retracts into the retracted condition. During this retraction, the cables in the cable guides 150 are protected and their displacement is controlled between the two fixed points 140, 220. This ensures that the cables do not get pinched or stuck between relatively moving parts, bent too much, pulled too hard, etc. The enclosure 210 can then be closed and locked with the cable management system 100 retracted therein.

The cable management system 100 as exemplified has a number of advantages over prior art cable management systems of which the Applicant is aware.

Many prior art cable management systems are fixed, not having any displaceable parts. This makes accessing cables and equipment very difficult post-installation, which may lead to sub-standard maintenance (or no maintenance) and/or cable damage. The present invention addresses this, at least partially, by providing a displaceable member 130.

If a prior art system had a removable part, the removal/displacement was not well controlled/guided, particularly with respect to the cables. This may lead to cable damage when closing such prior art systems because, for example, cables could get pinched, bent past their point of elastic deformation (a problem with optical fibre cables), etc. Further, if parts are entirely removable, this could lead to cables being pulled too hard, stretched, etc. The present invention addresses this, at least partially, by providing a guide mechanism 112, 118, 132, 138 and fixing formations 140 and/or cable guides 150.

Even if some parts of prior art systems are removable, actuating the removal thereof can be very difficult without a reliable displacement mechanism. The present invention addresses this, at least partially, by providing a displacement mechanism 114, 116, 136.

The cable management system 100 engages the manhole chamber 210 in a calculated and predictable fashion by use of the attachment formations 120, 222. This ensures good cooperation between the cable management system 100 engaging the manhole chamber 210, to constitute an effective cable management assembly 200.

The invention claimed is:

1. A cable management assembly which includes:
   a manhole chamber;
   a cable management system in the manhole chamber;
   a fixed member which has attachment formations associated therewith being attached or attachable to the manhole chamber;
   a displaceable member which is displaceable relative to the fixed member between at least an extended condition and a retracted condition;
   first cable fixing formations provided on the displaceable member;
   second cable fixing formations provided on the manhole chamber;
   a displacement mechanism configured to cause displacement of the displaceable member relative to the fixed member, the displacement mechanism including an actuator to translate an input from a user to displacement of the displaceable member;
   a guide mechanism for guiding the relative displacement of the displaceable member relative to the fixed member; and
   at least one cable guide in the form of a flexible conduit or tube, wherein:
   the cable guide defines a first cable entry/exit point at one end and a second cable entry/exit point at another end, the first and second cable entry/exit points being displaceable relative to each other;
   the first cable entry/exit point is fixed to the first cable fixing formations of the displaceable member;
   the second cable entry/exit point is fixed to the second cable fixing formations provided on the manhole chamber; and
   the cable guide is configured to accommodate at least one cable therein extending between the first cable fixing formations on the displaceable member and the second cable fixing formations on the manhole chamber, such that displacement of the displaceable member causes the cable guide and the at least one cable contained therein to be displaced therewith between the first and second cable entry/exit points.

2. The cable management assembly as claimed in claim 1, in which the guide mechanism is integrated with both of the fixed and displaceable members.

3. The cable management assembly as claimed in claim 1, in which the actuator is a mechanical coupling configured to receive mechanical rotational input from an external driver.

4. The cable management assembly as claimed in claim 1, in which the displacement mechanism includes a threaded shank with a travelling nut, the threaded shank connected to one of the fixed member or the displaceable member and the travelling nut connected to the other of the displaceable member or the fixed member.

5. The system as claimed in claim 1, in which the cable guide is in the form of a cluster/bundle of flexible conduits/tubes.

6. The cable management assembly as claimed in claim 1, in which:
   the fixed and/or displaceable members define an internal cavity;
   the fixed and/or displaceable members restrict or inhibit access to the cable, or to the cable fixing formations, in the retracted condition; and
   the fixed and/or displaceable members permit access, or are more accessible, to the cable, or the cable fixing formations, in the extended condition.

7. The cable management system as claimed in claim 1, in which the attachment formations are configured to attach the fixed member to a floor or base of the manhole chamber.

8. The cable management system as claimed in claim 1, in which the cable guide is be coiled in the retracted condition and uncoiled or partially uncoiled in the extended condition.

9. The cable management system as claimed in claim 1, in which the second cable fixing formations are in the form of a grommet or plug in a body of the manhole chamber which allows through-passage of the cable guide.

10. The cable management system as claimed in claim 9, which the second cable entry/exit point is outside the body of the manhole chamber.

11. The cable management system as claimed in claim 1, in which the displaceable member in its extended condition projects upwardly through an opening of the manhole chamber.

* * * * *